United States Patent
Ray et al.

(10) Patent No.: US 9,970,963 B2
(45) Date of Patent: May 15, 2018

(54) TEMPERATURE COMPENSATED CURRENT MEASUREMENT

(71) Applicant: POWER ELECTRONIC MEASUREMENTS LIMITED, Gloucester House, Wellington Street, Long Eaton, Nottingham, Nottinghamshire (GB)

(72) Inventors: William Frederick Ray, Long Eaton (GB); Christopher Rene Hewson, Beeston (GB); Joanne Marie Aberdeen, Beeston (GB)

(73) Assignee: Power Electronic Measurements Limited, Long Eaton (GB)

( * ) Notice: Subject to any disclaimer, the term of this patent is extended or adjusted under 35 U.S.C. 154(b) by 0 days. days.

(21) Appl. No.: 14/374,207

(22) PCT Filed: Feb. 1, 2013

(86) PCT No.: PCT/GB2013/050242
§ 371 (c)(1),
(2) Date: Jul. 23, 2014

(87) PCT Pub. No.: WO2013/114137
PCT Pub. Date: Aug. 8, 2013

(65) Prior Publication Data
US 2015/0015244 A1    Jan. 15, 2015

(30) Foreign Application Priority Data

Feb. 3, 2012    (GB) .................................. 1201992.3

(51) Int. Cl.
  *G01R 15/18*    (2006.01)
  *G01R 19/00*    (2006.01)
  *G01R 19/32*    (2006.01)

(52) U.S. Cl.
  CPC ....... *G01R 15/181* (2013.01); *G01R 19/0092* (2013.01); *G01R 19/32* (2013.01)

(58) Field of Classification Search
  CPC .. G01R 15/181; G01R 19/0092; G01R 19/32; G01R 11/185; G01R 15/146; G01R 15/183; H02M 2001/123; H02M 1/126
  (Continued)

(56) References Cited

U.S. PATENT DOCUMENTS 4,994,760 A * 2/1991 Roehrs ................. H03F 1/0277
  330/251
5,442,280 A    8/1995 Baudart
  (Continued)

FOREIGN PATENT DOCUMENTS

CN    201072427 Y    6/2008
CN    201489038 U    5/2010
  (Continued)

OTHER PUBLICATIONS

Search Report, issued in GB Patent Application No. 1201992.3, dated May 15, 2012, 4 pages.
(Continued)

*Primary Examiner* — Arleen M Vazquez
*Assistant Examiner* — Steven Yeninas
(74) *Attorney, Agent, or Firm* — Schwabe, Willamson and Wyatt, P.C.

(57) ABSTRACT

A temperature compensated current measurement device comprises a Rogowski coil having a terminating impedance arranged to adjust the attenuation of the coil to balance changes in coil sensitivity so that the output voltage indicative of measured current remains substantially unchanged, the terminating impedance having different values above and below a threshold frequency.

9 Claims, 6 Drawing Sheets

(58) Field of Classification Search
USPC .... 324/110, 117 R, 126, 127, 141, 142, 252, 324/547, 105; 336/65, 83, 173–177, 180, 336/182, 188, 200, 220–221, 229, 22
See application file for complete search history.

(56) References Cited

U.S. PATENT DOCUMENTS

| | | | |
|---|---|---|---|
| 5,539,354 A * | 7/1996 | Carsten | G01R 15/183 327/345 |
| 6,094,044 A * | 7/2000 | Kustera | G01R 15/18 324/127 |
| 6,614,218 B1 * | 9/2003 | Ray | G01R 15/181 324/117 R |
| 6,670,799 B1 * | 12/2003 | Bull | G01R 15/246 324/127 |
| 6,954,060 B1 | 10/2005 | Edel | |
| 6,984,979 B1 * | 1/2006 | Edel | G01R 15/185 324/253 |
| 7,402,991 B2 * | 7/2008 | Pollock | G01R 1/06766 324/126 |
| 8,610,188 B2 * | 12/2013 | Kerber | H01L 27/0805 257/296 |
| 8,743,513 B2 * | 6/2014 | Ward | H02H 1/0015 361/42 |
| 2006/0220774 A1 | 10/2006 | Skendzic | |
| 2008/0007249 A1 | 1/2008 | Wilkerson et al. | |
| 2008/0048646 A1 | 2/2008 | Wilkerson | |
| 2009/0045801 A1 * | 2/2009 | Mirow | G01R 19/32 324/126 |
| 2012/0313742 A1 * | 12/2012 | Kurs | B60L 11/182 336/180 |
| 2014/0354266 A1 * | 12/2014 | Hurwitz | G01R 19/0092 324/140 R |

FOREIGN PATENT DOCUMENTS

| | | |
|---|---|---|
| GB | 2034487 A | 6/1980 |
| JP | 2001083185 A | 3/2001 |
| JP | 2001102230 A | 4/2001 |
| JP | 2001343401 A | 12/2001 |

OTHER PUBLICATIONS

International Search Report & Written Opinion, issued in PCT Patent Application No. PCT/GB2013/050242, dated May 23, 2013, 7 pages.

Dupraz, J.P. et al., "Rogowski Coil: Exceptional Current Measurement Tool for Almost Any Application," Power Engineering Society General Meeting, Jun. 1, 2007, IEEE, pp. 1-8.

Faifer, M. et al., "An Electronic Current Transformer Based on Rogowski Coil," IEEE International Instrumentation and Measurement Technology Conference Proceedings, May 12-15, 2008, FMTC 2008, pp. 1554-1559.

Djokic, Branislav V. et al., "To What Extent Can the Current Amplitude Linearity of Rogowski Coils Be Verified?", IEEE Transactions on Instrumentation and Measurement, IEEE Service Center, Jul. 2011, vol. 60, No. 7, pp. 2409-2414.

Ray, W.F. et al., "High Performance Rogowski Current Transducers," Industry Applications Conference 2000, Conference Record of the 2000 IEEE, Oct. 8, 2000, vol. 5, pp. 3083-3090.

Ray, W.F. et al., "Wide Bandwidth Rogowski Current Transducers Part I: The Rogowski Coil," EPE, The European Power Electronics and Drives Journal, VDE Verlag, Berlin, Germany, Mar. 1, 1993, vol. 3, No. 1, pp. 51-59.

Ray, W.F. et al., "Wide Bandwidth Rogowski Current Transducers Part II: The Integrator," EPE, The European Power Electronics and Drives Journal, VDE Verlag, Berlin, Germany, Jun. 1, 1993, vol. 3, No. 2, pp. 116-122.

Yutthagowith, P. et al., "Design and Construction of a Rogowski's Coil with Compensated RC Integrators for Measuring Impulse Current," Power Engineering Conference, 2007, IPEC, Dec. 3, 2007, pp. 189-192.

Stygar, W., et al., "High Frequency Rogowski Coil Response Characteristics," IEEE Transactions on Plasma Science, Mar. 1982, vol. PS-10, No. 1, pp. 40-44.

Ramboz, John D., "Machinable Rogowski Coil, Design, and Calibration," IEEE Transactions on Instrumentation and Measurement, Apr. 1996, vol. 45, No. 2, pp. 511-515.

Chinese Patent Application No. 201380008040A Office Action dated Nov. 4, 2015, 8 pages including English translation.

* cited by examiner

TEMPERATURE COMPENSATED CURRENT MEASUREMENT

CROSS-REFERENCE TO RELATED APPLICATIONS

The present application is a national phase entry under 35 U.S.C. § 371 of International Application No. PCT/GB2013/050242, filed Feb. 1, 2013, entitled "TEMPERATURE COMPENSATED CURRENT MEASUREMENT," which designated, among the various States, the United States of America, and claimed priority to Great Britain Application No. 1201992.3, filed Feb. 3, 2012. These applications are hereby incorporated by reference herein in their entireties.

TECHNICAL FIELD

This invention relates to a method and system for applying temperature compensation for current measurement. It relates in particular to devices for measuring electric currents, commonly called Rogowski transducers, and for which the temperature compensation is arranged to provide correctly damped high frequency performance.

BACKGROUND

The principle of operation of Rogowski transducers is well known. Details of the design and operation of Rogowski transducers can be found for example in "*Wide bandwidth Rogowski current transducers—Part 1: The Rogowski Coil*" European Power Electronics Journal Vol 3 No 1 Mar. 1993 pp 51-59 by W F Ray & R M Davis and in "*Wide bandwidth Rogowski current transducers—Part 2: The Integrator*" European Power Electronics Journal Vol 3 No 2 Jun. 1993 pp 116-122, by W F Ray.

In general terms a Rogowski transducer comprises a Rogowski coil and an integrator. A Rogowski coil is an electrically conductive coil having a substantially uniform turns density of N (turns/m) wound on a structure referred to herein as a "former". The former comprises a non-magnetic material, typically plastic, of cross sectional area A (m$^2$), and the coil is arranged to form a closed loop. In order to measure the value of a current in an electrical conductor, the Rogowski coil is placed around the conductor in order to induce a voltage (E) therein and providing a transducer output signal indicative of the sensed current in the conductor.

FIG. 1 shows schematically a Rogowski transducer comprising a typical Rogowski coil for which the coil loop can be opened and closed (generally called a "clip-around" coil) and for which the coil cross-section is circular. This type of coil is very well known. In FIG. 1 the Rogowski transducer utilises a conventional Rogowski coil 11 wound on a plastic former having a circular cross-section. The coil winding has a fixed end 13 connected to an integrator 12 and a free end 14. The free end 14 is returned to the fixed end 13 using a wire 15 situated in a hole along the central axis of the former.

Provided the coil in FIG. 1 is of uniform turns density N (turns/m), each turn having the same cross sectional area A (m$^2$), and the coil is arranged to form a closed loop surrounding the current I$_1$ (Amps) to be measured, then the voltage E (V) induced in the coil is proportional to the rate of change of the measured current dI$_1$/dt according to the equation $$E = \mu \cdot NA \frac{dI_1}{dt} = H \frac{dI_1}{dt} \tag{1}$$

where H=μ·NA is the coil sensitivity (Vs/Amp) and μ is the magnetic permeability of the former material (normally 4π·10$^{-9}$ H/m).

The coil terminal voltage E$_1$ is connected to an integrator such that the output voltage from the integrator V$_{out}$ is given by $$V_{out} = \frac{1}{T_I} \int E_1 \cdot dt \tag{2}$$

where T$_1$ is the integrator time constant.

If the coil termination voltage E$_1$ is assumed to be the same as the induced voltage E, the overall transducer output voltage V$_{out}$ is instantaneously proportional to the measured current I$_1$ according to the relationship $$V_{out} = \frac{H}{T_I} I_1 \tag{3}$$

The current waveform is shown in FIG. 1 as being a square wave. As the skilled reader will appreciate, this is convenient for illustrating the basic operation of the Rogowski coil but in practice this waveform could be of any shape and/or could comprise discontinuous pulses. Furthermore the integrator could be of analogue or digital form, as is already well known.

In other forms, the integrator comprises an operational amplifier 21, an input resistor and a feedback capacitor in the known inverting configuration as shown in FIG. 2. An example of this is GB 2034487A.

FIG. 3 shows an alternative form of known Rogowski coil for which the coil loop is permanently closed (generally called a "fixed" coil) and for which the coil cross section is rectangular. This type of coil is described, for example, in "Rogowski Coil" Patent JP2001102230 Filed 29, Sep. 1999 Published 13, Apr. 2001, by O Akira & I Satoru.

For this type of coil a printed circuit board (PCB) is generally used for the coil former and each coil turn comprises printed circuit strips on the major surfaces of the board together with plated though-holes joining the strips so as to make coil turns as shown. The coil is connected to an integrator such as shown schematically in FIG. 1 and the principle of the current measurement is the same as defined by equations (1) to (3). Other arrangements of printed circuit Rogowski coils are known.

In FIG. 3 the former of the board comprises a non-conductive substrate made of epoxy resin that is preferably filled with stratified glass, or a ceramic material. A four layer PCB is used in FIG. 3, wherein the PCB has first 31, second 32, third 33 and fourth 34 surfaces as shown. Conductive strips are deposited or etched on the outer (first 31 and fourth 34) surfaces using known photo-resistive processes. These strips are connected by plated through holes 39 to form a helical coil which proceeds in a first direction around the substrate.

A return conductor 37, which extends in an opposite direction to the coil, is deposited on the inner (second 32 and third 33) surfaces. The coil and return conductor 37 are connected to provide a 'go and return' path to minimise the influence of conductors outside the Rogowski coil.

Current measurement using Rogowski coils according to known methods is prone to inaccuracy. For example, if a Rogowski coil is not uniform then the voltage induced in the coil E will vary depending on the position of the current I within the Rogowski coil loop. Furthermore, external currents outside the Rogowski coil loop may contribute to the induced voltage E, thereby causing a measurement error. For good accuracy it is therefore desirable that the turns density (N) and area (A) are uniform around the complete loop. Printed circuit coils of the type shown in FIG. 3 are particularly good in this respect and are therefore often used in applications where high accuracy is important.

Another source of inaccuracy in known Rogowski transducers is the arrangement by which a Rogowski coil is connected to its termination. In FIG. 3 the first 35 and second 36 ends of the printed circuit winding are shown. The inner printed circuit conductor 37 is connected to the first end 35 and runs within the coil turns in a circular path to a connection point 38 adjacent to the second end 36. The external connections to the coil are then made to the second end 36 and to the connection point 38. The reason for this arrangement is to minimise or eliminate induced voltages in the coil due to magnetic fields perpendicular to the plane of the coil loop as described for example in *Machinable Rogowski Coil, Design and Calibration" IEEE Transactions on Instrumentation & Measurement*, Vol 45 No 2 Apr. 1996 pp 511-515, by J D Rambos. There are other arrangements which achieve this aim such as having two windings, one inside the other, one providing a forward path for the coil and the other a return path.

Another known source of inaccuracy in Rogowski transducers is the error arising due to changes in the coil temperature. Measuring devices or instruments often need to operate in a hot environment which can have a heating effect on the measuring device or instrument. If the temperature of the coil increases then the former will expand. This results in both elongation of its length and enlargement of its cross-sectional area. The elongation has the effect of reducing the turns density N of the winding and hence reducing the coil sensitivity H, whereas the increase in cross-sectional area A increases the coil sensitivity H. For a given current $I_1$, changes in coil sensitivity will cause changes in the output voltage $V_{out}$ as specified by equation (3).

The precautions for minimising errors mentioned hereabove are known. In the case of error due to temperature change the principle means of eliminating such error is explained in GB 2034487 referred to above.

The change in sensitivity of a Rogowski coil when it is subject to thermal expansion can be represented by the linear relationship $$H = H_0(1 + \alpha_H \theta) \quad (4)$$

where $H_0$ is the nominal sensitivity at nominal ambient temperature (say 20° C.), $\theta$ is the temperature difference between the actual coil temperature and the 20° C. temperature threshold. and $\alpha_H$ is the corresponding coil sensitivity temperature coefficient (° C.$^{-1}$), which can be predefined for a particular Rogowski coil. For example, it can be obtained experimentally by heating the coil.

The temperature compensation described herein is particularly, though not exclusively, applicable to Rogowski transducers for which, when the coil temperature increases, the resulting increase in area A predominates over the decrease in turns density N, in which case the temperature coefficient $\alpha_H$ is positive.

The temperature compensation for current measurement applies equally to cases of increasing and decreasing temperature. In the decreasing case, $\alpha_H$ remains positive and the coil sensitivity will decrease for a decrease in temperature. That is, applying equation (4) to such a scenario; $\theta$ is negative and, for positive $\alpha_H$, H becomes less than $H_0$.

The resistance $R_1$ of the coil comprises the sum of the resistance of all its turns. This resistance $R_1$ increases with temperature when the turns are made of copper wire (or copper strip in the case of a printed circuit coil) or other conducting material.

The coil resistance $R_1$ increases linearly with temperature and can be represented by the relationship $$R_1 = R_{10}(1 + \alpha_R \theta) \quad (5)$$

where $R_{10}$ is the nominal resistance at 20° C., $\theta$ is the temperature difference between the actual coil temperature and the 20° C. temperature threshold and $\alpha_R$ is the corresponding temperature coefficient (° C.$^{-1}$) for the coil windings. The temperature coefficient for copper is $\alpha_R = 3.8 \ 10^{-3}$° C.$^{-1}$. To put this value in context, the temperature coefficient for a high quality resistor is typically $1.5 \ 10^{-5}$° C.$^{-1}$. By using a high quality resistor for the terminating impedance $R_2$ it may be assumed that $R_2$ is relatively constant and unaffected by temperature changes.

The time constant for the integrator shown in FIG. 2 is given by $T_1 = (R_1 + R_2) \cdot C$.

Hence from (3)

$$\frac{V_{out}}{I_1} = \frac{H_0(1 + \alpha_H \theta)}{(R_{10}(1 + \alpha_R \theta) + R_2) \cdot C} = \frac{H_0(1 + \alpha_H \theta)}{(R_{10} + R_2 + R_{10}\alpha_R) \cdot C}$$

Taking the nominal time constant value $T_B = (R_{10} + R_2) \cdot C$ $$\frac{V_{out}}{I_1} = \frac{H_0(1 + \alpha_H \theta)}{T_{10}\left\{1 + \left(\frac{R_{10}}{R_{10} + R_2}\right)\alpha_R \theta\right\}} \quad (6)$$

Thus by choosing $R_2$ such that $$\left(\frac{R_{10}}{R_{10} + R_2}\right) \cdot \alpha_R = \alpha_H \quad (7)$$

the effect of temperature $\theta$ can be eliminated and $$\frac{V_{out}}{I_1} = \frac{H_0}{T_{10}}$$

for all values of $\theta$.

GB 2034487 envisages an arrangement "to achieve a high accuracy over a wide frequency band extending in particular to very low frequencies". However the arrangement shown in GB 2034487 has an integrator circuit without any low frequency limit as shown in FIG. 2. Such an arrangement would suffer from very significant low frequency noise and drift. Practical integrators require a low frequency limit by placing something in parallel with the integrating capacitor such as a filter network as explained in "*Wide bandwidth Rogowski current transducers—Part 2: The Integrator*" *European Power Electronics Journal* Vol 3 No 2 Jun. 1993 pp 116-122, by W F Ray.

GB 2034487 also does not teach how to achieve satisfactory performance at high frequencies of transducer output. For satisfactory performance it is necessary for the Rogowski coil to be adequately damped. Without any terminating resistance (eg with the coil open circuit) the transducer output is susceptible to sustained oscillations due to the inter-action of the coil inductance and capacitance.

An object of the embodiments disclosed herein is to provide temperature compensation at low frequencies and damping at higher frequencies of transducer output.

An invention is set out in the claims.

The frequency below which the terminating impedance provides correct temperature compensation and above which the terminating impedance provides correct damping is for convenience referred to as the threshold frequency $f_{TH}$. Damping is only necessary at or around the natural frequency of the coil $f_0$. Hence $f_{TH}$ should be arranged as high as possible to provide a wide frequency range over which temperature compensation is provided whilst subject to the requirement that $f_{TH}$ must be sufficiently less than $f_0$ to enable satisfactory damping at $f_0$.

According to an aspect a current measurement device is provided, said current measuring device comprising a conductive coil that is arranged to produce a voltage as a result of a current being measured by the device. The conductive coil has a temperature dependent coil sensitivity factor. The device further comprises a terminating impedance connected to the conductive coil, wherein the terminating impedance may take on a first value below a predetermined frequency threshold, wherein that first value is suitable for providing temperature compensated error cancellation, and may take on a second different value above the predetermined frequency threshold, wherein that second value is suitable for providing damping in the coil. The predetermined frequency threshold can be arranged to be higher than the maximum frequency of the current to be measured but lower than the natural or resonant frequency of the coil.

The terminating impedance also connects the conductive coil to an output circuit, for example an integrator, wherein that output circuit is arranged to produce an output voltage that is an analogue of the current being measured. The terminating impedance attenuates the voltage produced by the conductive coil by an attenuation factor which is temperature dependent. The first value of the terminating impedance is arranged so that when there is a temperature change in the conductive coil which causes a change in the coil sensitivity factor, the attenuation factor also changes in the same proportion so that the value of the output voltage produced by the device is substantially unchanged as a result of the temperature change.

The second value of the terminating impedance may be arranged to be substantially equal to the characteristic impedance of the coil.

The coil is preferably a Rogowski coil. The output circuit of the device preferably includes an integrator.

The Rogowski coil is preferably a printed circuit Rogowski coil. The connection of the coil to the terminating impedance may be by means of a cable.

The terminating impedance is preferably a resistor or behaves as a resistor for the range of frequencies for which current measurement is required.

According to an aspect of the disclosed embodiments the terminating impedance comprises a first resistor in series with the parallel combination of a second resistor and a capacitor where the first resistor is the terminating resistance value required for damping the coil and where the sum of the resistors gives the terminating resistance required for temperature compensation. The value of the capacitor is chosen to provide a suitable threshold frequency of the transducer output above which damping applies and below which temperature compensation applies.

Other combinations of resistors and capacitors may be used to provide terminating impedances which provide both temperature compensation and damping according to the invention.

Thus a sophisticated yet easy to implement means is provided for compensating for the effects of temperature change on a coil such as a Rogowski coil so that they do not compromise the accuracy of current measurement obtainable over an acceptable range of frequencies using a device comprising the coil, such as Rogowski transducer whilst at the same time ensuring that the coil is adequately damped at and around its natural frequency.

FIGURES

Embodiments will now be described by way of example only, with reference to the Figures, of which:

OVERVIEW

In overview, a system and method are provided for enhancing the accuracy of electric current measurement using Rogowski transducers, in particular to the minimisation of errors in such measurements due to temperature changes. The method and system comprise improvements to the electrical termination of Rogowski coils, wherein the electrical termination can help to minimise errors due to temperature changes without impairing the dynamic behaviour of the system.

The improved electrical termination comprises connecting a termination impedance across the output of the Rogowski coil in a Rogowski transducer, wherein that terminating impedance attenuates the voltage output by the coil by an attenuation factor K. The terminating impedance is carefully selected so that its attenuation properties compensate for the effects of coil sensitivity on the output of the Rogowski transducer if the temperature of the Rogowski transducer, or of the coil within the transducer, changes during operation. An increase in temperature usually has the effect of expanding the core of a Rogowski coil and thus increasing its sensitivity. This may cause a change in the output voltage of the transducer that is not reflective of any change in the current being measured.

According to the methods and apparatus described, by choosing a suitable arrangement of components for terminating the Rogowski coil, the attenuation factor can change with temperature in a manner such that for an appropriate range of frequencies its effects cancel out any effects of the change in coil sensitivity whilst the dynamic behaviour at higher frequencies is not impaired.

DETAILED DESCRIPTION

In order for the improvements described herein to be better understood, it is necessary to consider a general equivalent circuit for connecting a Rogowski coil to an electronic integrator and to consider the dynamic behaviour of the coil due to its inductance and capacitance.

Figure 3:
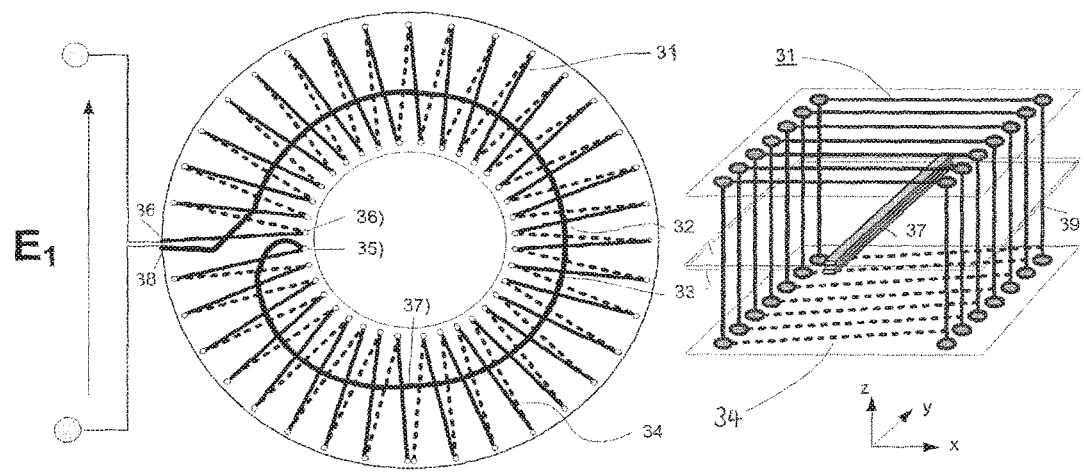
FIG. 3 shows a further example of a Rogowski coil implemented on a multilayer PCB and showing the return conductor.
Figure 4:
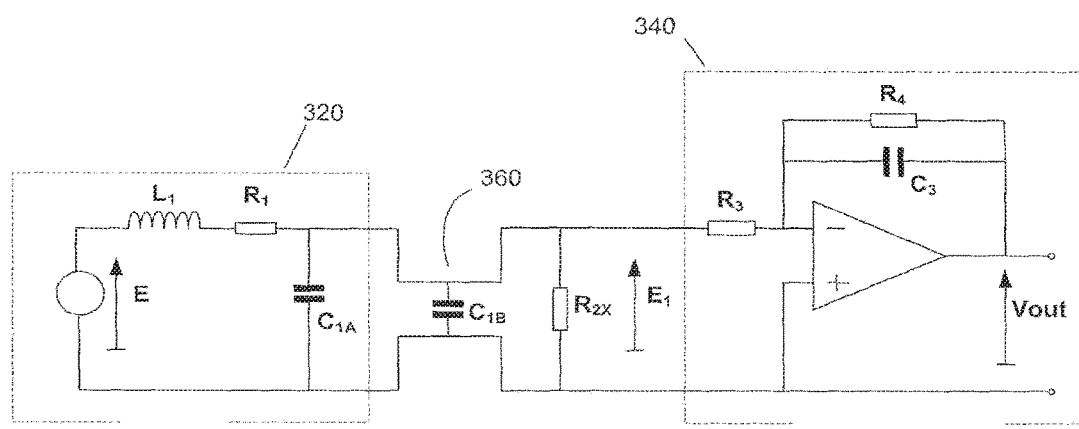
FIG. 4 shows an electrical equivalent circuit for the connection of a Rogowski coil to an electronic integrator and including a terminating impedance comprising a resistor.

FIG. 4 shows such a circuit for, for example, a Rogowski transducer as shown in FIG. 3 in which the coil 320 is connected to an integrator 340. The integrator 340 may be closely attached to the coil 320 or connected by means of a cable 360 of any practical length. The coil 320 may be represented by the induced voltage E and components $R_1$ and $L_1$ representing the coil resistance and inductance. The capacitance $C_{1A}$ of the coil 320 and the capacitance $C_{1B}$ of the cable 360 (if present) are added to give a combined capacitance $C_1$. The coil 320 and cable 360 are usually terminated by a terminating resistance $R_2$ which provides electrical damping for the coil 320 and prevents sudden current transients causing oscillations at high frequency due to the inductance—capacitance combination. Ideally for good damping $R_2$ has the value $R_2 \approx \sqrt{(L_1/C_1)}$.

The terminating resistance $R_2$ comprises a resistor $R_{2X}$ shown in FIG. 4 in parallel with the input impedance $R_3$ of the integrator 340. In FIG. 4 the terminating resistance $R_2$ is given by:

$$R_2 = \frac{R_{2X} \cdot R_3}{R_{2X} + R_3}.$$

The following description firstly establishes the value for the terminating resistance $R_2$ which for an appropriate range of frequencies provides temperature compensated current measurement, and then shows how the terminating resistance can be modified also to provide satisfactory damping for the coil.

The temperature compensated current measurement described herein is applicable to Rogowski transducers for which the terminating resistance $R_2$ is substantially constant and unaffected by temperature changes. This may be because $R_{2X}$ and $R_3$ have negligible temperature coefficients or because they are situated away from the coil 320 and do not experience the change in temperature experienced by the coil 320. It is assumed herein that the accuracy of the overall Rogowski transducer is not substantially affected by changes in $R_2$. This assumption has been examined in relation to equation (5) above, and does not impair the overall accuracy of the described approach herein.

As described above (see equation (7)), it has been recognised that the value of $R_2$ can be selected such that the error due to the change in coil sensitivity when the temperature of a Rogowski coil changes, as defined in equation (4), is substantially eliminated.

For the majority of the range of frequencies for which a typical Rogowski transducer operates and for which accurate current measurement is required, the impedance of the component $L_1$ which represents the coil 320 inductance is given by $2\pi f L_1$ (where f is the frequency) and is much smaller than $R_2$. Also, the impedance of the component $C_1$ which represents the coil 320 (and cable 360) capacitance is given by $1/(2\pi f C_1)$ and is much greater than $R_2$.

Because the impedance of $L_1$ is relatively very low and the impedance of $C_1$ is relatively very high, the skilled person will recognise that in practice $L_1$ and $C_1$ can be ignored for the relevant measurement range. When the impedance from those two components is ignored, there is an attenuation factor K (K<1) between the coil induced voltage E and the terminal voltage $E_1$ across the terminating resistance $R_2$, which is given by $$K = \frac{E_1}{E} = \frac{R_2}{R_1 + R_2} \tag{8}$$

The overall relationship for the Rogowski transducer, previously equation (3), thus becomes $$V_{out} = \frac{KH}{T_I} I_1 \tag{9}$$

Wherein $V_{out}$ is the output voltage from the integrator 340 and $T_1$ is the integrator time constant.

If the coil temperature increases then, since the coil winding material is typically copper or some similar conducting material, the value of coil resistance $R_1$ will increase. As a result the value of the attenuation factor K will decrease according to the relationship $$K = \frac{K_0}{1 + \alpha_K \theta} \tag{10}$$

where $K_0$ is the nominal attenuation at 20° C., $\theta$ is the temperature difference between the actual coil temperature and the 20° C. temperature threshold and $\alpha_K$ is the corresponding temperature coefficient for K (° C.$^{-1}$). The value of $\alpha_K$ can be obtained from values that are predetermined or can readily be determined experimentally, as shown in the equations labelled (12) herebelow.

It has been recognised herein that, if the temperature coefficients for coil sensitivity H and attenuation K are equal (i.e. $\alpha_H = \alpha_K$), then any error in current measurements due to the temperature increase in the coil will be eliminated. This can be seen from expanding equations (4), (9) and (10) above:

Substituting in (9) for K (from (10)) and H (from (4)) gives $$V_{out} = \frac{K_0 H_0 (1 + \alpha_H \theta)}{(1 + \alpha_K \theta) T_I} I_1 \qquad (11)$$

or $$V_{out} = \frac{K_0 H_0}{T_I} I_1$$

if $$\alpha_H = \alpha_K$$

Hence the effect of temperature change $\theta$ is eliminated.

As mentioned above, $\alpha_H$ can be predefined (or readily obtained experimentally) for a particular Rogowski coil. In addition, and as set out below, it has been recognised herein that $\alpha_K$ can be determined from resistance values and the resistance temperature coefficient $\alpha_R$, all of which can either be determined experimentally and/or can be known (and indeed can be selected) in advance for a particular Rogowski transducer circuit. Therefore it is possible to select and/or manipulate the resistance values and/or the values of temperature coefficients $\alpha_H$ and $\alpha_K$ in a Rogowski transducer circuit in order to make $V_{out}$ independent of temperature as shown in (11) above.

The values of nominal attenuation $K_0$ and attenuation temperature coefficient $\alpha_K$ can be determined as follows. By substituting equations (5) and (8) for "K" in equation (10) and taking $R_2$ to be unaffected by temperature change, it may be shown that the attenuation factor K for the circuit shown in FIG. 4 herein is related to the Rogowski coil's nominal resistance $R_{10}$ by the following relationships $$K = \frac{R_2}{R_2 + R_{10}(1 + \alpha_R \theta)} = \frac{\left\{\frac{R_2}{R_2 + R_{10}}\right\}}{1 + \left\{\frac{R_{10}}{R_2 + R_{10}}\right\} \alpha_R \theta} = \frac{K_0}{1 + \alpha_K \theta}$$

Therefore:

$$K_0 = \frac{R_2}{R_{10} + R_2} \qquad (12)$$

and $$\alpha_K = \frac{R_{10}}{R_{10} + R_2} \alpha_R$$

The value of $\alpha_R$ for copper is well known and hence by choosing the value for $R_2$ for a given $R_{10}$ the desired value for $\alpha_K$ ($=\alpha_H$) can be obtained. Alternatively $\alpha_R$ could be measured experimentally by heating the coil, and $\alpha_K$ can then be determined using equation (12) above.

In general terms, the terminating impedance $R_2$ preferably comprises, or at least behaves as, a resistor for the range of frequencies for which current measurement by Rogowski transducer is required.

Figure 1:
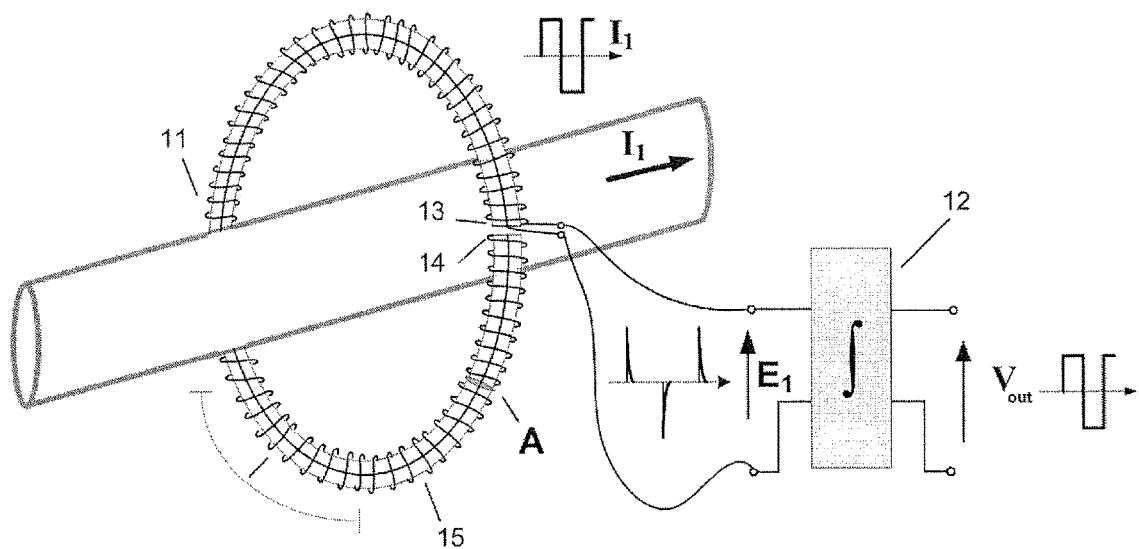
FIGS. 1 and 2 show schematically examples of a Rogowski coil connected to an electronic integrator.
Figure 2:
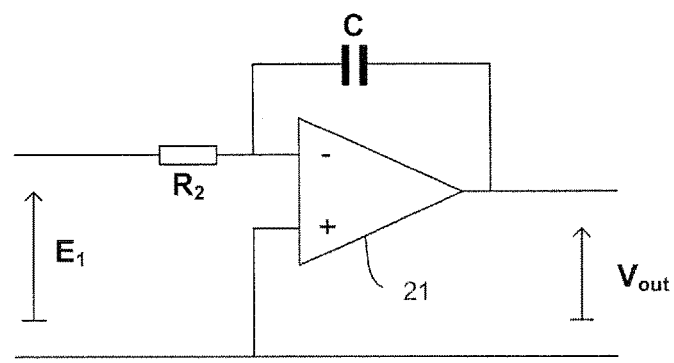

Since for cancellation of error $\alpha_H = \alpha_K$, and because it is generally desirable that $R_2$ is substantially greater than $R_{10}$, the relationships defined in equation (12) above shows that it is preferable that the resistance temperature coefficient $\alpha_R$ is substantially greater than the coil sensitivity temperature coefficient $\alpha_H$. This is the case for printed circuit coils but may also apply to conventional coils such as shown in FIG. 1. Therefore the temperature compensation described herein can work for both these types of Rogowski coils.

As mentioned above, the terminating resistance $R_2$ in the Rogowski transducer circuit also needs to provide a damping effect at some frequencies. However, the value of the terminating resistance $R_2$ required to cause cancellation of the temperature changes is unlikely to be the same value as is ideal for damping the coil ($\sqrt{(L_1/C_1)}$).

In the case that $R_2$ is substantially greater than $\sqrt{(L_1/C_1)}$ the coil will be under-damped at frequencies around the natural frequency of the coil. For continuous sinusoidal current waveforms the lack of adequate damping will not result in undue disadvantage provided that the natural frequency of the coil is substantially greater than the range of frequencies for the required current measurement. However if the current to be measured contains sudden step changes or transients this may cause substantial oscillations in the measured waveform which may give rise to errors and which is in any case undesirable. The terminating impedance can be further arranged to meet both the requirements of temperature error cancellation and of damping the coil.

Figure 5:
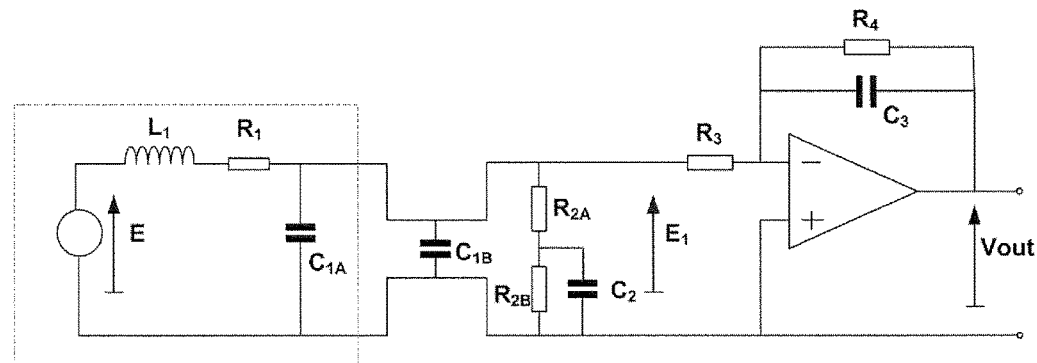
FIG. 5 shows an electrical equivalent circuit for the connection of a Rogowski coil to an electronic integrator and including a terminating impedance comprising a resistor-capacitor combination for cases where the required terminating resistance for temperature error correction is greater than the required value for damping the coil.

If the terminating resistance value for cancellation is greater than the ideal value for damping, which is usually the case, then this objective may be achieved by using the terminating impedance shown in the equivalent circuit of FIG. 5. The single terminating resistor $R_{2X}$ shown in FIG. 4 is replaced by a terminating impedance comprising a resistance $R_{2A}$ in series with a combination of a resistance $R_{2B}$ in parallel with a capacitor $C_2$. The value of the capacitor $C_2$ is chosen such that for the range of frequencies for which accurate measurement is required (up to some arbitrary frequency which is substantially less than the natural frequency of the Rogowski coil) the impedance of $C_2$ (given by $1/(2\pi f C_2)$) is very much greater than $R_{2B}$. The effect of $C_2$ is therefore insignificant for this frequency range and the terminating impedance acts as a resistance comprising $(R_{2A} + R_{2B})$ in parallel with $R_3$ which can be arranged to have the required value $R_2$ for temperature error cancellation. However at frequencies around and above the natural frequency of the coil, the impedance of the capacitor $C_2$ is arranged to be much less than $R_{2B}$ such that $C_2$ acts as a short circuit across $R_{2B}$. The terminating impedance therefore acts substantially as a resistance of $R_{2A}$ in parallel with $R_3$ which can be arranged to have the required value $\sqrt{(L_1/C_1)}$ for damping the coil.

The combination of $R_{2A}$, $R_{2B}$ and $C_2$ in FIG. 5 has an impedance $Z_2$ given by $$Z_2 = R_{2A} + \frac{R_{2B}}{1 + j \cdot (f/f_{TH})} \qquad (13)$$

Where $f_{TH}$ is a threshold frequency:

$$f_{TH} = \frac{1}{2\pi \cdot R_{2B} C_2} \qquad (14)$$

The operator $j = \sqrt{(-1)}$ and is used to represent phasor quantities—sinusoidal variations which have a phase displacement relative to each other as will be known to the skilled reader.

Hence if the frequency $f \ll f_{TH}$, $Z_2 \approx R_{2A} + R_{2B}$, but if $f \gg f_{TH}$, $Z_2 \approx R_{2A}$.

The terminating impedance is $Z_2$ in parallel with $R_3$.

Thus according to an embodiment, the terminating impedance connected across the output of the coil and cable comprises the input impedance of the integrator in parallel with a second impedance, the second impedance comprising a first resistor in series with a combination of a second resistor in parallel with a capacitor, the capacitor value being selected such that at a low part of the frequency range (below the coil natural frequency) the terminating impedance acts as a resistance having the required value for cancelling the variation of sensitivity with temperature and such that at the coil natural frequency the terminating impedance acts as a resistance having the required value for damping the coil oscillations.

The invention will now be further illustrated by means of examples in which the first two examples show how the value of the coil terminating resistance $R_2$ required for temperature compensation can be reduced at higher frequencies to provide correct damping for the coil.

In the case that $R_2$ is substantially less than $\sqrt{(L_1/C_1)}$ the coil will be over-damped at high frequencies around the natural frequency of the coil. This will substantially reduce the bandwidth of the coil and may reduce the frequency range of the measured currents. However the terminating impedance may also be adjusted to at least partly remedy this affect, as discussed in the third example.

First Example

To illustrate the behaviour of the arrangement of FIG. 3 as represented by the circuit diagram in FIG. 4, values for the design are provided below by way of example. These values are typical and are not critical to achieve the temperature compensation provided herein—other values could be used instead:

Coil sensitivity, $H \approx 25.6$ nVs/A
Coil inductance, $L_1 \approx 2.56$ μH
Coil+cable capacitance, $C_1 \approx 400$ pF
Ideal damping resistance, $\sqrt{(L_1/C_1)} \approx 80\Omega$.
Natural time constant for the coil and cable, $\sqrt{(L_1 C_1)} \approx 32$ ns
Natural frequency of the coil $\approx 5.0$ MHz
Coil resistance at 20° C., $R_{10} \approx 22.7\Omega$.
Temperature coefficient for copper, $\alpha_R = 3.8 \; 10^{-3}$ °C.$^{-1}$.
Temperature coefficient for coil sensitivity, $\alpha_H = 7.8 \; 10^{-5}$ °C.$^{-1}$.

Typically the substrate material expands with temperature in the z direction shown in FIG. 3. The expansion is small and causes an increase in Rogowski coil turn area A, but no change in the coil turns density N. The typical temperature coefficient for expansion in the z direction is $7.8 \; 10^{-5}$ °C.$^{-1}$. Hence the temperature coefficient $\alpha_H = 7.8 \; 10^{-5}$ °C.$^{-1}$.

From equation (12), for cancellation of error due to temperature changes (i.e. to achieve a degree of attenuation K such that $\alpha_K = \alpha_H$) the desired value of terminating resistance is $R_2 = 47.7 \cdot R_{10}$, giving $R_2 \approx 1080\Omega$.

The above-defined value for $R_2$ is determined from the values of the temperature coefficients for coil sensitivity H and coil resistance $R_1$ and from the coil resistance $R_1$ itself. These can all be measured and an accurate value for $R_2$ can thus be determined. In practice the value for $R_2$ only needs to be sufficiently accurate to give reasonable error cancellation. For example without compensation the error due to a 50° C. change in temperature would be 0.39%. If this can be reduced to 0.05% or less then the compensation would be regarded as satisfactory in most real-world applications.

Once its target value has been calculated, the desired terminating resistance $R_2$ can be readily implemented using known electronic components. For example, for an integrator with an input resistance $R_3 >> 1080\Omega$, a resistor $R_{2X} = 1080\Omega$ could be fitted to achieve the desired compensation. Alternatively if for example $R_3 = 2200\Omega$ then a resistor $R_{2X} = 2120\Omega$ would be required. In either case the parallel combination $R_2 = 1080\Omega$ is significantly greater than the ideal terminating resistance from a damping perspective, which would be around $80\Omega$. Hence the transducer would be susceptible to oscillations in the presence of step changes in the current being measured.

The arrangement of FIG. 3 in combination with the circuit of FIG. 5 addresses this possible oscillation problem and enables both the cancellation of error due to temperature change and the appropriate damping of the Rogowski coil at high frequency. The design of such a system is illustrated using the list of numerical values above, for which the desired value of terminating resistor for error cancellation is $R_2 \approx 1080\Omega$, the desired value for coil damping is $\approx 80\Omega$ and $R_3 >> 1080\Omega$.

Referring to FIG. 5, the value of the resistor $R_{2A}$ is made $= 80\Omega$ and $R_{2B} = 1000\Omega$ such that at low frequencies, for which $C_2$ is effectively open circuit, the resistance value is $\approx 1080\Omega$ and at high frequencies, for which $C_2$ is effectively short circuit, the resistance value is $\approx 80\Omega$. A suitable value for $C_2$ is 860 pF.

From equation (13) above, the terminating impedance is $$Z_2 = 80 + \left( \frac{1000}{1 + j \cdot (f/185))} \right) \cdot \Omega,$$

where f is the frequency in kHz.

From (14) above, putting $R_{2B} = 1000\Omega$ and $C_2 = 860$ pF gives $f_{TH} = 185$ kHz. This will be the threshold frequency below which temperature compensation is appropriate. The coil natural frequency is around 5 MHz for which damping is required and which is substantially greater than $f_{TH}$.

Figure 7:
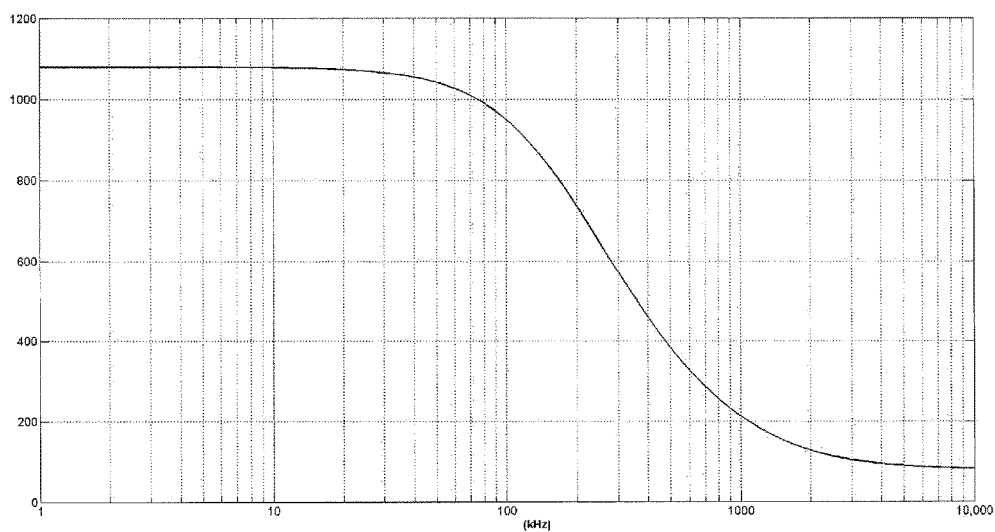
FIG. 7 shows the variation of the terminating impedance magnitude with frequency for FIGS. 5 and 6.

FIG. 7 shows the variation of the magnitude of the terminating impedance $R_2$ with frequency for the circuit of FIG. 5. The impedance is mainly resistive (i.e. has zero phase angle) at low and at high frequencies although at frequencies around 185 kHz there will be significant phase angle. This is why it is permissible to treat the impedance as being equivalent to a resistor for temperature compensation purposes ($f << f_{TH}$) and for damping purposes ($f >> f_{TH}$). However FIG. 7 shows the impedance magnitude for all frequencies.

As seen in FIG. 7, the circuit behaves as a $1080\Omega$ resistance up to a frequency of approx 20 kHz, which is a sufficient frequency range for most current measurements. For this range the coil resistance and terminating resistance provide attenuation to the induced coil voltage E as defined by equation (8). For the values used in the above example the attenuation factor $K_0 = 0.9794$.

Referring again to FIG. 7, it can be seen that at 5 MHz, the natural frequency of the coil and cable, the impedance approx behaves as an $80\Omega$ resistance which is the desired value for damping the coil. Therefore the behaviour of the circuit in practice holds with the theory presented herein.

As shown in FIGS. 4 and 5, the coil terminal voltage $E_1$ is connected to an integrator. The integrator shown is a conventional inverting integrator utilising an operational amplifier, an integrating resistor $R_3$ and an integrating capacitor $C_3$. The integrating time constant $T_1 = C_3 R_3$. This time constant can be set to give the desired overall sensitivity $V_{out}/I_1$ for the transducer as defined by equation (9). For the above example a time constant $T_1 = 25$ μs would give a typical sensitivity of approx 1 mV/Amp.

At very low frequency (lower than the required range for measurement) the integrator has to be stabilised to avoid drift and excessive low frequency noise. This may be achieved by utilising the resistor $R_4$ shown in FIGS. 4 and 5 to limit the low frequency gain. Preferably resistor-capacitor networks can be used for this stabilisation, as is known to the skilled reader. Other forms of integrator could also be used—for example non-inverting or digital.

Figure 8:
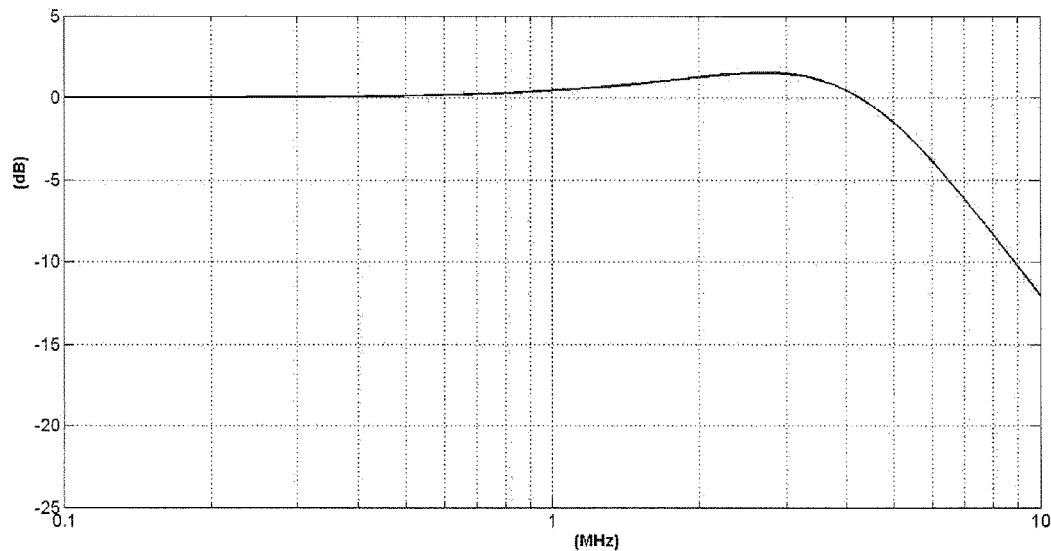
FIG. 8 shows the overall variation of sensitivity with frequency at high frequencies for FIG. 5.

FIG. 8 shows the variation of overall sensitivity with frequency for the combined coil-integrator measurement system for frequencies above 100 kHz for the circuit of FIG. 5, applying the numerical values given above. The magnitude has been normalised such that the sensitivity at lower frequencies is unity (0 dB). There is a slight resonance at approx 2.7 MHz of approx 1.5 dB which demonstrates the damping provided by the terminating impedance of FIG. 5.

Having the integrator input impedance $R_3 \gg R_2$, as used hereabove is not a necessary condition for the purpose of the temperature compensation described herein. To demonstrate this, $R_3$ will now be taken to be 2200Ω with $R_2 \approx 1080Ω$ and $\sqrt{(L_1/C_1)}=80$ as previously.

For the circuit of FIG. 5 the combined value of resistor $R_{2A}$ in parallel with $R_3$ should be 80Ω. This gives $R_{2A}=83Ω$.

The value of $R_{2B}$ is such that $R_{2A}+R_{2B}$ in parallel with $R_3$ gives the desired value for $R_2$, i.e. $R_2 = \dfrac{(R_{2A} + R_{2B}) \cdot R_3}{R_{2A} + R_{2B} + R_3} = 1080 \cdot \Omega$ For $R_{2A}=83Ω$ and $R_3=2200Ω$, the appropriate value for $R_{2B}$ is 2040Ω. The value for $C_2$ should remain 860 pF to achieve the same basic relationship between the termination impedance and frequency shown in FIG. 7.

The terminating impedance is given by $\dfrac{2200 \cdot Z_2}{2200 + Z_2} \Omega,$ where $Z_2 = 83 + \left(\dfrac{2040}{1 + j \cdot (f/90.7)}\right) \cdot \Omega$ and f is the frequency in kHz. The resulting variation of the magnitude of the terminating impedance with frequency is very closely similar to FIG. 7 and the overall variation of normalised sensitivity with frequency is very closely similar to FIG. 8.

Therefore, this example demonstrates the ability of a carefully selected terminating resistance in providing temperature compensation and damping for a Rogowski transducer.

Second Example

Figure 6:
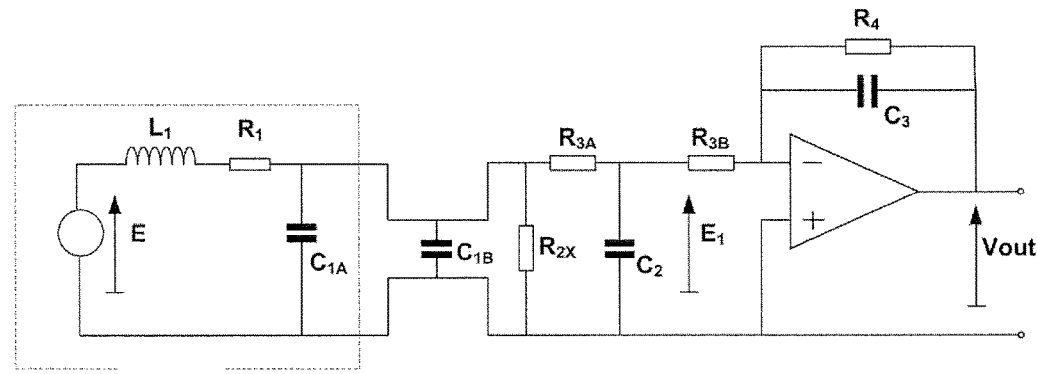
FIG. 6 shows a further electrical equivalent circuit for the connection of the coil to the electronic integrator and including a terminating impedance comprising an alternative resistor-capacitor combination for cases where the required terminating resistance for temperature error correction is greater than the required value for damping the coil.

Another circuit embodiment for a Rogowski transducer is shown in FIG. 6 which is similar to the circuits of FIGS. 4 and 5. In this case the terminating impedance comprises a resistance $R_{2X}$ in parallel with the combination of a resistance $R_{3A}$ in series with a capacitor $C_2$. In order to provide improved accuracy via temperature compensation for the Rogowski transducer as described herein, the value of the capacitor $C_2$ can be chosen such that for the range of frequencies for which accurate measurement is required (up to some arbitrary frequency which is substantially less than the natural frequency of the Rogowski coil) the impedance of $C_2$ (given by $1/(2\pi f C_2)$) is very much greater than $R_{3B}$.

The effect of $C_2$ is therefore insignificant for this frequency range and the terminating impedance acts as a resistance of value $R_3=R_{3A}+R_{3B}$ in parallel with $R_{2X}$. The parallel combination can be arranged to have the required value ($R_2$) for temperature-compensated error cancellation.

i.e. $R_2 = \dfrac{(R_{3A} + R_{3B}) \cdot R_{2X}}{R_{3A} + R_{3B} + R_{2X}}$

However at frequencies around and above the natural frequency of the coil, the impedance of the capacitor $C_2$ is arranged to be less than $R_{3B}$ such that the terminating impedance acts as a resistance of value $R_{3A}$ in parallel with $R_{2X}$. The parallel combination can then be arranged to have the required value for damping the coil at those frequencies around and above the natural frequency.

Looking back at the previous numerical example, the required value of $R_2 \approx 1080Ω$ for temperature compensation $R_2 \approx 80Ω$ for damping the coil can also be achieved with the circuit of FIG. 6. For an integrator input resistor $R_{3B}=2200Ω$ as before the appropriate values for $R_{2X}$ and $R_{3A}$ are $R_{2X}=2050Ω$ and $R_{3A}=83Ω$. The value for $C_2$ should remain 860 pF to achieve the same basic relationship between the termination impedance and frequency shown in FIG. 7.

The terminating impedance is given by $\dfrac{2050 \cdot Z_3}{2050 + Z_3} \Omega,$ where $Z_3 = 83 + \left(\dfrac{2200}{1 + j \cdot (f/84.1)}\right) \cdot \Omega$ and f is the frequency in kHz. The variation of the magnitude of the terminating impedance with frequency is again very closely similar to FIG. 7.

Figure 9:
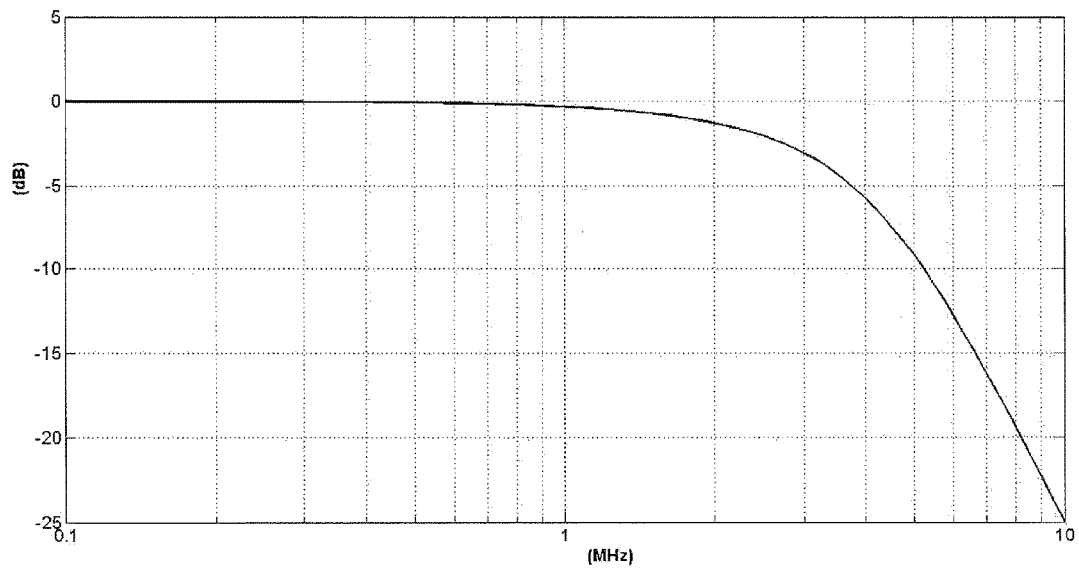
FIG. 9 shows the overall variation of sensitivity with frequency at high frequencies for FIG. 6.

FIG. 9 shows the variation of normalised overall sensitivity with frequency for the combined coil-integrator measurement system of FIG. 6. This is similar to FIG. 8 but the coil damping is improved and there is no resonance. Hence using a circuit as shown in FIG. 6 for temperature compensation in a Rogowski transducer is advantageous.

The embodiments of FIG. 5 and FIG. 6 give very similar results as demonstrated by the numerical examples given above. However in general the embodiment of FIG. 6 gives more flexibility in the choice of suitable values to achieve the dual criteria of temperature compensation for error cancellation and satisfactory coil damping.

Third Example

The embodiments of FIGS. 5 and 6 are appropriate when the terminating resistance for temperature error cancellation is substantially greater than the ideal impedance for damping the coil. However, this will not always be the case. The circuit of FIG. 10 is appropriate for the case where the terminating resistance for temperature error cancellation is substantially less than the value required for damping the coil.

If the terminating resistance $R_2$ is substantially less than $\sqrt{(L_1/C_1)}$ then the coil will be substantially over-damped and the overall sensitivity will decrease at frequencies above a high frequency limit $f_H=1/(2\pi T_H)$, where the time constant $T_H=L_1/R_2$ and where $f_H$ is substantially less than natural time frequency for the coil=$1/(2\pi\sqrt{(L_1C_1)})$. This reduction in the bandwidth of the coil may result in a reduction of the frequency range of the measured currents which would be undesirable. However the terminating impedance may be adjusted as follows to remedy or partly remedy this affect.

When the desired $R_2$ is substantially less than $\sqrt{(L_1/C_1)}$ the probe sensitivity is reduced at high frequencies. This can be seen from the example in FIG. 11 (dashed line). There is no reasonable way in which we can doctor the terminating resistor such that it behaves as the low value $R_2$ at low frequencies and behaves as $\sqrt{(L_1/C_1)}$ at high frequencies (the converse of examples 1 and 2). So we simply fit the desired $R_2$ and instead of doctoring $R_2$ we doctor the integrator behaviour.

Figure 10:
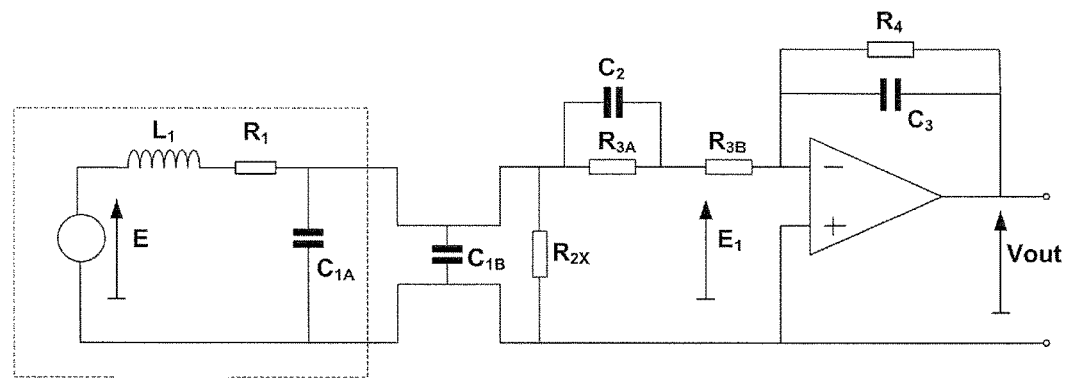
FIG. 10 shows an electrical equivalent circuit for the connection of the coil to the electronic integrator and including a terminating impedance comprising a resistor-capacitor combination for cases where the required terminating resistance for temperature error correction is less than the required value for damping the coil.
Figure 11:
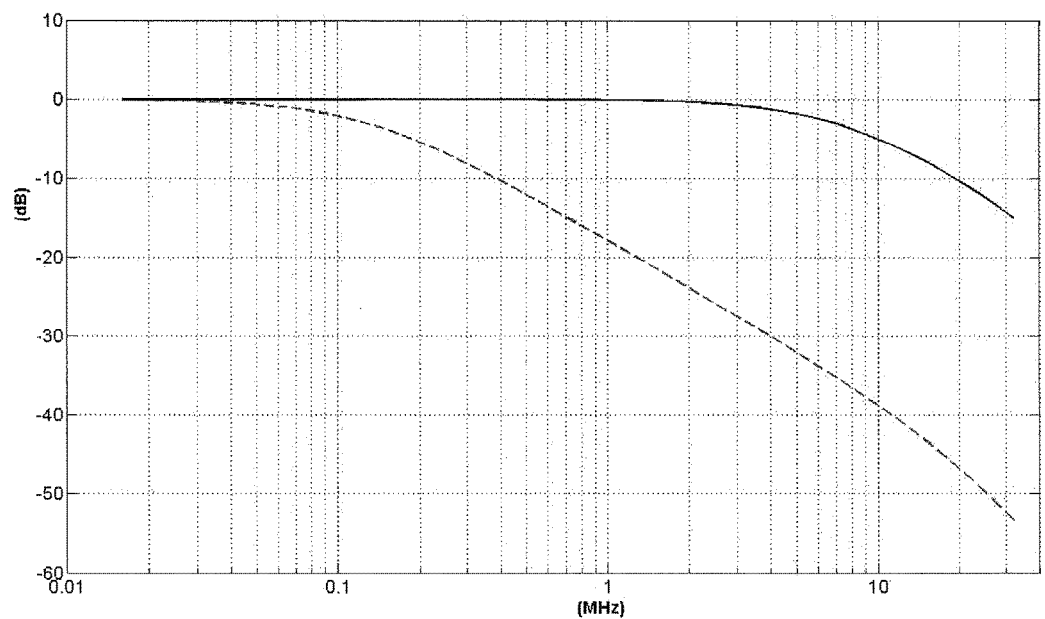
FIG. 11 shows the overall variation of sensitivity with frequency at high frequencies for FIG. 10.

By utilising the $C_2$, $R_{3A}$, $R_{3B}$ combination shown in FIG. 10 we arrange that at low frequencies the integrator has an effective time constant $T_1=C_3(R_{3A}+R_{3B})$ and at high frequencies $T_1=C_3 R_{3B}$. Since the integrator gain is inversely proportional to its time constant, and for $R_{3A} \gg R_{3B}$, the integrator gain at high frequency will be greater than the integrator gain at low frequency. We can therefore arrange to bring the probe sensitivity back to its nominal value at high frequencies as shown in FIG. 11 (solid line).

The $C_2$, $R_{3A}$, $R_{3B}$ combination on the input of an operational amplifier is the well known "lead network", which will be familiar to the skilled reader.

For FIG. 10 the values for the capacitor $C_2$ and resistor $R_{3A}$ are chosen such the time constant $C_2 R_{3A} \approx T_H = L_1/R_2$ and $R_{3B}$ is chosen such that $R_{3B} \ll R_{3A}$. Hence for frequencies substantially below the high frequency limit $f_H$ the impedance of $C_2$ is substantially greater than $R_{3A}$ whereas for frequencies substantially below $f_H$ the impedance of $C_2$ is substantially greater than $R_{3A}$. For frequencies below $f_H$, $C_2$ therefore acts as an open circuit across $R_{3A}$ and the integrator time constant is therefore given by $T_1=C_3(R_{3A}+R_{3B}) \approx C_3 R_{3A}$. On the other hand for frequencies above $f_H$ $C_2$ acts as a short circuit across $R_{3A}$ and the integrator time constant is therefore given by $T_1=C_3 R_{3B}$.

For frequencies below $f_H$ the resultant terminating impedance for the coil is equivalent to the resistance $R_{2X}$ in parallel with $R_{3A}+R_{3B}$ which may be set equal to the required value $R_2$ for temperature compensation. Generally $R_{3A} \gg R_{2X}$ such that $R_{2X} \approx R_2$.

Since the overall sensitivity is inversely proportional to the integrator time constant $T_1$, the effect of the $C_3$, $R_{3A}$, $R_{3B}$ network is to boost the overall sensitivity at frequencies above $f_H$ compared with frequencies below $f_H$ by the factor $(R_{3A}+R_{3B})/R_{3B}$ where $R_{3A} \gg R_{3B}$. The resultant effect is that for frequencies above $f_H$ the integrator gain increases so as to compensate for the reduction in sensitivity due to the over-damped coil.

The integrating time constant for the nominal sensitivity $T_1=C_3(R_{3A}+R_{3B})$ can be set to give the desired overall sensitivity $V_{out}/I_1$ for the transducer as defined by equation (6).

To illustrate the behaviour of the transducer of FIG. 3 comprising the circuit of FIG. 10, values for the design are provided below by way of example. These values are typical but are not critical for the purpose of the temperature compensation described herein—other values could be used.
Coil sensitivity, H≈250 nVs/A
Coil inductance, $L_1$≈100 µH
Coil+cable capacitance, $C_1$≈100 pF
Ideal damping resistance, $\sqrt{(L_1/C_1)}$≈1000Ω.
Natural time constant for the coil and cable, $\sqrt{(L_1 C_1)}$≈100 ns
Natural frequency of the coil≈1.6 MHz
Coil resistance at 20° C., $R_{10}$≈1.68Ω.
Temperature coefficient for copper, $\alpha_R$=3.8 $10^{-3}$° $C.^{-1}$.
Temperature coefficient for coil sensitivity, $\alpha_H$=7.8 $10^{-5}$° $C.^{-1}$.
Limiting time constant with $R_2$=80Ω, $T_H$=1.25 µs
Limiting frequency $f_H$=127 kHz From equation (7), to achieve the desired attenuation K for cancellation of error ($\alpha_K=\alpha_H$) the desired value of terminating resistance is $R_2$=47.7·$R_{10}$, giving $R_2$≈80Ω. This is much lower than the desired value for damping the coil (1000Ω).

FIG. 11 shows (dashed line) the variation of normalised overall sensitivity with frequency for the combined coil-integrator measurement system without any compensation from the terminating network (i.e. capacitor $C_2$ is not connected). It will be seen that for frequencies above $f_H$=127 kHz the sensitivity substantially decreases.

FIG. 11 also shows (solid line) the variation of normalised overall sensitivity with frequency with values for the compensation network of $C_2$=100 pF, $R_{3A}$=12,500Ω (such that $C_2 R_{3A}$=1.25 µs) and $R_{3B}$=100Ω. It will be seen that the decrease in sensitivity is compensated and the sensitivity remains at its nominal value up to approx 3 MHz. Therefore the arrangement in FIG. 10 (or similar) can be used to give effective temperature compensation and damping when the desired terminating impedance for temperature compensation is less than the impedance required for damping purposes.

The value of terminating resistance to achieve the objective of temperature compensation is generally different from the value required to damp the coil. For higher frequencies, for which damping is necessary, the resistance value changes to that required for damping. In embodiments this entails using a terminating impedance comprising some resistors and capacitors which for lower frequencies, for which accurate measurement is required, behaved as a resistor with the value required for temperature compensation, and which for higher frequencies behaved as a impedance with the value required for coil damping.

Variants

The embodiments and examples described hereabove demonstrate how temperature compensation for a Rogowski coil using a terminating resistance may be applied in both cases where the desired value of terminating resistance for achieving temperature-compensated error cancellation is very much greater than the value required for damping the coil and vice-versa. However the same principles can be applied to cases where the difference between the desired values of terminating resistance for these two purposes is less significant.

The embodiments described have included a printed circuit Rogowski coil as shown in FIG. 3. However alternative forms of PCB Rogowski coils can be used, an example of which is provided in FIG. 12.

Figure 12:
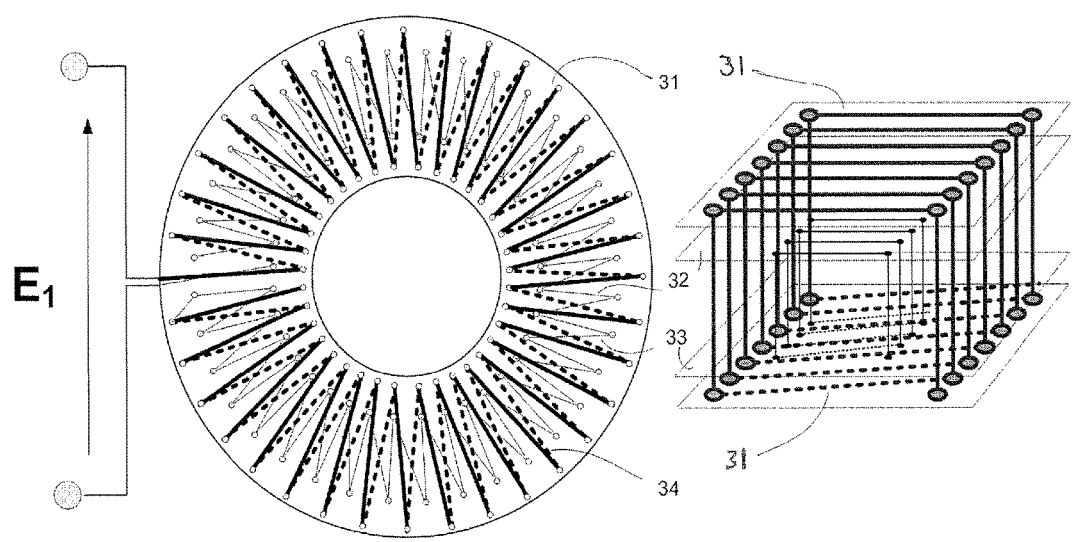
FIG. 12 shows a further example of a Rogowski coil implemented on a multilayer PCB and having concentric windings connected as a go-return circuit.

The Rogowski coil former of FIG. 12, like for FIG. 3, utilises a four layer PCB having surfaces outer 31, 34 and inner 32, 33 surfaces as shown. Conductive strips are deposited or etched on the outer surfaces 31, 34 using known photo-resistive processes. These strips are connected by plated through holes as shown to form a first helical winding which proceeds in a first direction around the substrate. However, unlike for FIG. 3, conductive strips are also deposited or etched on the inner surfaces 32, 33. These strips are also connected by plated through holes as shown to form a second helical winding which resides within the first helical winding as shown and which proceeds in an opposite direction around the substrate.

The two windings are connected in series to provide a coil with a 'go and return' path to minimise the influence of conductors outside the Rogowski coil aperture. A Rogowski coil similar to FIG. 12 has been previously published in "High Precision Rogowski Current Transformer" U.S. Pat. No. 7,579,824 B2 Filed 29, Sep. 2006 Published 03, Apr. 2008, by D Rea, K Kaye & M Zawisa but does not have inner and outer windings with uniform turns densities as shown in the embodiment of FIG. 12. A uniform turns density is essential for a Rogowski coil to reject currents external to the coil aperture.

It is also possible to use other types of Rogowski coil within a Rogowski transducer in order to achieve the temperature compensation and improved accuracy of current measurement as described herein. The Rogowski coils may be implemented on a PCB or on a similar material. Or, conventional Rogowski coils in clip-around form may in some cases be used.

For the purpose of illustration, the temperature threshold applied in the equations and examples hereabove is 20° C. However any other suitable temperature threshold may instead be applied.

Some numerical examples have been given to show how the principles described herein work in practice. However these numerical values are not limiting. The principles described herein can be used to achieve temperature compensation using a terminating resistance for a wide range of coils and for a wide range of numerical requirements. The value of the terminating resistance required for temperature compensation can be implemented whilst still providing accurate and reliable damping of the circuit at certain frequencies, as described in detail with respect to FIGS. 5, 6 and 10 above.

The Rogowski transducer can be used to measure current in any suitable electrical device or component. The temperature compensation and damping described herein serves to enhance the accuracy of the current measurement provided by the Rogowski transducer, regardless of whether or by how much its temperature changes during operation, whilst also providing satisfactory damping for the Rogowski coil.

The invention claimed is:

1. A current measuring device comprising a conductive coil, said conductive coil being arranged to produce a voltage as a result of a current being measured by the current measuring device, said conductive coil having a temperature-dependent coil sensitivity factor associated therewith; the device further comprising:
   a terminating impedance connected to the conductive coil, said terminating impedance being arranged to attenuate the voltage produced by the conductive coil by a temperature-dependent attenuation factor and to connect the conductive coil to an output circuit, wherein the terminating impedance comprises a combination of a resistor and a capacitor; and
   the output circuit, wherein the output circuit includes an active integrator to produce an output voltage indicative of the current being measured;
   wherein the terminating impedance has a first impedance value below a predetermined threshold frequency for the output voltage and a second, different impedance value above said predetermined threshold frequency, wherein the first impedance value is arranged so that, when there is a temperature change in the conductive coil which causes a corresponding change in the coil sensitivity factor, the attenuation factor also changes so that the value of the output voltage remains substantially unchanged, and wherein said second impedance value is determined so that it provides damping in the conductive coil.

2. A current measuring device as claimed in claim 1 wherein the conductive coil comprises a Rogowski coil.

3. A current measuring device as claimed in claim 2 wherein the Rogowski coil comprises any of: a clip-around coil, a closed-loop coil, a printed circuit Rogowski coil and a coil wound on a non-conductive former.

4. A current measuring device as claimed in claim 1 wherein, in operation, the terminating impedance behaves like a resistor at least over a predetermined frequency range.

5. A current measuring device as claimed in claim 1 wherein said predetermined frequency threshold is greater than a range of frequencies for the measured current but lower than a natural frequency of the conductive coil.

6. A current measuring device as claimed in claim 1 wherein the conductive coil has an associated coil resistance wherein the value of the coil resistance is less than a value of the terminating impedance at least over part of an operational frequency range of the current measuring device.

7. A current measuring device as claimed in claim 6 wherein a value of the coil resistance associated with the conductive coil is temperature dependent.

8. A current measuring device as claimed in claim 1 wherein the active integrator includes an operational amplifier.

9. A method of measuring a current, comprising:
   providing a current measuring device comprising a conductive coil, said conductive coil being arranged to produce a voltage as a result of a current being measured by the current measuring device, said conductive coil having a temperature-dependent coil sensitivity factor associated therewith;
   wherein the providing the current measuring device includes:
      providing a terminating impedance connected to the conductive coil, said terminating impedance being arranged to attenuate the voltage produced by the conductive coil by a temperature-dependent attenuation factor and to connect the conductive coil to an output circuit, wherein the terminating impedance comprises a combination of a resistor and a capacitor; and
      providing an output circuit, wherein the output circuit includes an active integrator to produce an output voltage indicative of the current being measured; and
   using the current measuring device to measure the current, wherein the using the current measuring device to measure the current includes:
      providing, with the terminating impedance, a first impedance value below a predetermined threshold frequency for the output voltage and a second, different impedance value above said predetermined threshold frequency, wherein the first impedance value is arranged so that, when there is a temperature change in the conductive coil which causes a corresponding change in the coil sensitivity factor, the attenuation factor also changes so that the value of the output voltage remains substantially unchanged, and wherein said second impedance value is determined so that it provides damping in the conductive coil.

* * * * *